US012583674B2

(12) United States Patent
Ito et al.

(10) Patent No.: US 12,583,674 B2
(45) Date of Patent: Mar. 24, 2026

(54) OVERHEAD STORAGE SYSTEM

(71) Applicant: Murata Machinery, Ltd., Kyoto (JP)

(72) Inventors: Yasuhisa Ito, Ise (JP); Yu Kusama, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 353 days.

(21) Appl. No.: 18/269,665

(22) PCT Filed: Sep. 3, 2021

(86) PCT No.: PCT/JP2021/032524
§ 371 (c)(1),
(2) Date: Jun. 26, 2023

(87) PCT Pub. No.: WO2022/149305
PCT Pub. Date: Jul. 14, 2022

(65) Prior Publication Data
US 2024/0051747 A1 Feb. 15, 2024

(30) Foreign Application Priority Data
Jan. 5, 2021 (JP) ................................ 2021-000563

(51) Int. Cl.
*B65G 1/04* (2006.01)
*B65G 1/06* (2006.01)
*H01L 21/677* (2006.01)

(52) U.S. Cl.
CPC ........... *B65G 1/0464* (2013.01); *B65G 1/065* (2013.01); *H01L 21/6773* (2013.01); *H01L 21/67733* (2013.01)

(58) Field of Classification Search
CPC ...... B61B 3/02; B65G 1/0492; B65G 1/0464; B65G 1/065; H01L 21/6773;
(Continued)

(56) References Cited

U.S. PATENT DOCUMENTS

2008/0156760 A1  7/2008  Maetaki
2012/0128452 A1  5/2012  Murata et al.
(Continued)

FOREIGN PATENT DOCUMENTS

CN  101209774 A  7/2008
CN  102470982 A  5/2012
(Continued)

OTHER PUBLICATIONS

International Search Report dated Nov. 16, 2021, of corresponding International Application No. PCT/JP2021/032524, along with English translation.

*Primary Examiner* — Glenn F Myers
(74) *Attorney, Agent, or Firm* — DLA Piper LLP (US)

(57) ABSTRACT

An overhead storage system includes an overhead transport vehicle including a traveling unit configured to travel on a rail arranged in a grid pattern and a body section suspended from the traveling unit and configured to hold an article below the rail; a storage rack disposed below the rail; and a control unit configured to control operation of the overhead transport vehicle. The body section includes a transfer device capable of transferring the article to and from the storage rack. In the storage rack, a plurality of article placement areas on which the article is able to be placed by the transfer device are set in a storage area corresponding to each of cells forming a matrix in the grid pattern of the rail.

4 Claims, 7 Drawing Sheets

SYS 100, 20 21 22 R 21 22 22
Z
Y X
SYSTEM CONTROLLER
5
30 17a 31 32
10 50
17 15
18 12
11 16
14 S
13b 13b
13 13a
Ma
13a
W W
α
Mb M0
M AX1,AX2

(58) Field of Classification Search
CPC ......... H01L 21/67769; H01L 21/67733; H01L
21/67736; H01L 21/67706
See application file for complete search history.

(56) References Cited

U.S. PATENT DOCUMENTS

| | | | |
|---|---|---|---|
| 2015/0332948 A1* | 11/2015 | Ikeda ................ | H01L 21/67736 |
| | | | 700/230 |
| 2016/0240417 A1 | 8/2016 | Tomida | |
| 2016/0272422 A1 | 9/2016 | Yoo et al. | |
| 2019/0189488 A1* | 6/2019 | Ito ............................. | B61B 3/02 |
| 2020/0203203 A1 | 6/2020 | Ito | |
| 2020/0216263 A1* | 7/2020 | Fjeldheim ............ | B65G 1/0464 |
| 2020/0223633 A1* | 7/2020 | Stadie .................... | B65G 15/28 |
| 2020/0343118 A1 | 10/2020 | Torazawa et al. | |
| 2021/0229917 A1* | 7/2021 | Austrheim ........... | B65G 1/0485 |
| 2022/0020621 A1 | 1/2022 | Ogo et al. | |
| 2022/0332500 A1 | 10/2022 | Masuda | |

FOREIGN PATENT DOCUMENTS

| | | |
|---|---|---|
| CN | 105984687 A | 10/2016 |
| JP | 2019-081639 A | 5/2019 |
| JP | 2020066499 A | 4/2020 |
| KR | 10-2016-0067850 | 6/2016 |
| WO | 2018/037762 | 3/2018 |
| WO | 2020/090288 | 5/2020 |
| WO | 2021/053978 | 3/2021 |

* cited by examiner

SYS

SYS

OVERHEAD STORAGE SYSTEM

TECHNICAL FIELD

This disclosure relates to an overhead storage system.

BACKGROUND

As a technology related to an overhead storage system, a rail-guided vehicle system described in WO 2018/037762, for example, is known. In the rail-guided vehicle system described in WO 2018/037762, a rail is arranged in a grid pattern, and an overhead transport vehicle (rail-guided vehicle) transports an article along the rail while holding it below the rail. In the rail-guided vehicle system described in WO 2018/037762, a storage rack (rack section of a storage device) is disposed below the rail, and articles are stored in the storage rack.

In the overhead storage system described above, for example, there is a need to increase the efficiency of storing articles to store a large number of articles without upsizing the system.

Thus, it could be helpful to provide an overhead storage system that can increase the efficiency of storing articles.

SUMMARY

We provide an overhead storage system including: an overhead transport vehicle including a traveling unit configured to travel on a rail arranged at least partially in a grid pattern and a body section suspended from the traveling unit and configured to hold an article below the rail; a storage rack disposed below the rail and configured to store the article; and a control unit configured to control operation of the overhead transport vehicle. The body section includes a transfer device capable of transferring the article to and from the storage rack. In the storage rack, a plurality of article placement areas on which the article is able to be placed by the transfer device are set in a storage area corresponding to each of cells forming a matrix in the grid pattern of the rail.

In the storage area corresponding to each cell in the storage rack, the article placement areas on which the article can be placed by the transfer device are set. Thus, it is possible to store a large number of articles without upsizing the storage rack, for example, and increase the efficiency of storing the articles.

The rail may include a plurality of first rails extending along a first direction, a plurality of second rails extending along a second direction intersecting the first direction, and a plurality of intersection rails arranged with a gap with respect to respective ends of the first rails and respective ends of the second rails, the gap allowing passage of a coupling section coupling the traveling unit to the body section. Each cell may be an area defined by a pair of the first rails aligned in the second direction and a pair of the second rails aligned in the first direction. With this configuration, the overhead transport vehicle can be specifically configured to travel along the rail arranged in the grid pattern.

With the overhead transport vehicle stopped on one of the cells, the control unit may execute transfer control of causing the transfer device to transfer the article to or from any of the article placement areas in the storage area corresponding to this cell. In this example, to or from any of the article placement areas in the storage area, the article can be specifically transferred.

A first cell and a second cell adjacent to the first cell may be present as the cells, and in the transfer control, with the overhead transport vehicle stopped on the first cell, the article may be transferred to or from any of the article placement areas in the storage area corresponding to the first cell, and when the control unit is executing the transfer control, the transfer device may be within the first cell without jutting into the second cell when viewed from above. In this example, while an overhead transport vehicle is executing the transfer control on the first cell, jutting of the transfer device of the overhead transport vehicle into the second cell ("jutting") can be prevented, which allows another overhead transport vehicle to pass over the second cell. With this configuration, the transport efficiency can be also increased.

The article may include a container body and a lid provided on a side portion of the container body, and the article with the lid facing outside of the storage area may be able to be placed in each of the article placement areas in the storage rack. The transfer device may include: an article holding unit configured to suspend and hold the article by gripping the article; a lifting drive unit configured to raise and lower the article holding unit; and a look-down sensor provided to the lifting drive unit and disposed, on a side opposite to a side closer to the lid, at a predetermined length apart from the article held by the article holding unit when viewed from above and configured to output a detection wave downward. The article is placed on the article placement area with the lid facing outside of the storage area, and thus the look-down sensor disposed apart from the article is located within the storage area in plan view during execution of the transfer control, unlike when the article is placed on the article placement area with the lid facing inside of the storage area. With this configuration, jutting of the transfer device due to the presence of the look-down sensor can be prevented during execution of the transfer control.

Advantageous Effects of Invention

The overhead storage system can thereby increase the efficiency of storing articles.

REFERENCE SIGNS LIST

Figure 1:
FIG. 1 is a side view illustrating an overhead storage system according to an example.

4 . . . storage rack
4C . . . storage area
6 . . . processing device
10 . . . body section
13 . . . article holding unit
14 . . . lifting drive unit 18 . . . transfer device
20 . . . traveling unit
45 . . . article placement area
50 . . . vehicle controller (control unit)
62 . . . load port
100 . . . overhead transport vehicle
C . . . cell
C1 . . . first cell
C2 . . . second cell
M . . . article
M0 . . . container body
Mb . . . lid
R . . . rail
R1 . . . first rail
R2 . . . second rail
R3 . . . intersection rail
S . . . look-down sensor
SYS . . . overhead storage system

DETAILED DESCRIPTION

An example will now be described with reference to the drawings. In the drawings, the scale is changed to be expressed appropriately for convenience of explanation. One direction along a horizontal plane is denoted as an X direction, a horizontal direction orthogonal to the X direction is denoted as a Y direction, and the vertical direction is denoted as a Z direction. The terms "up" and "down" correspond to upper and lower directions in the vertical direction.

Figure 2:
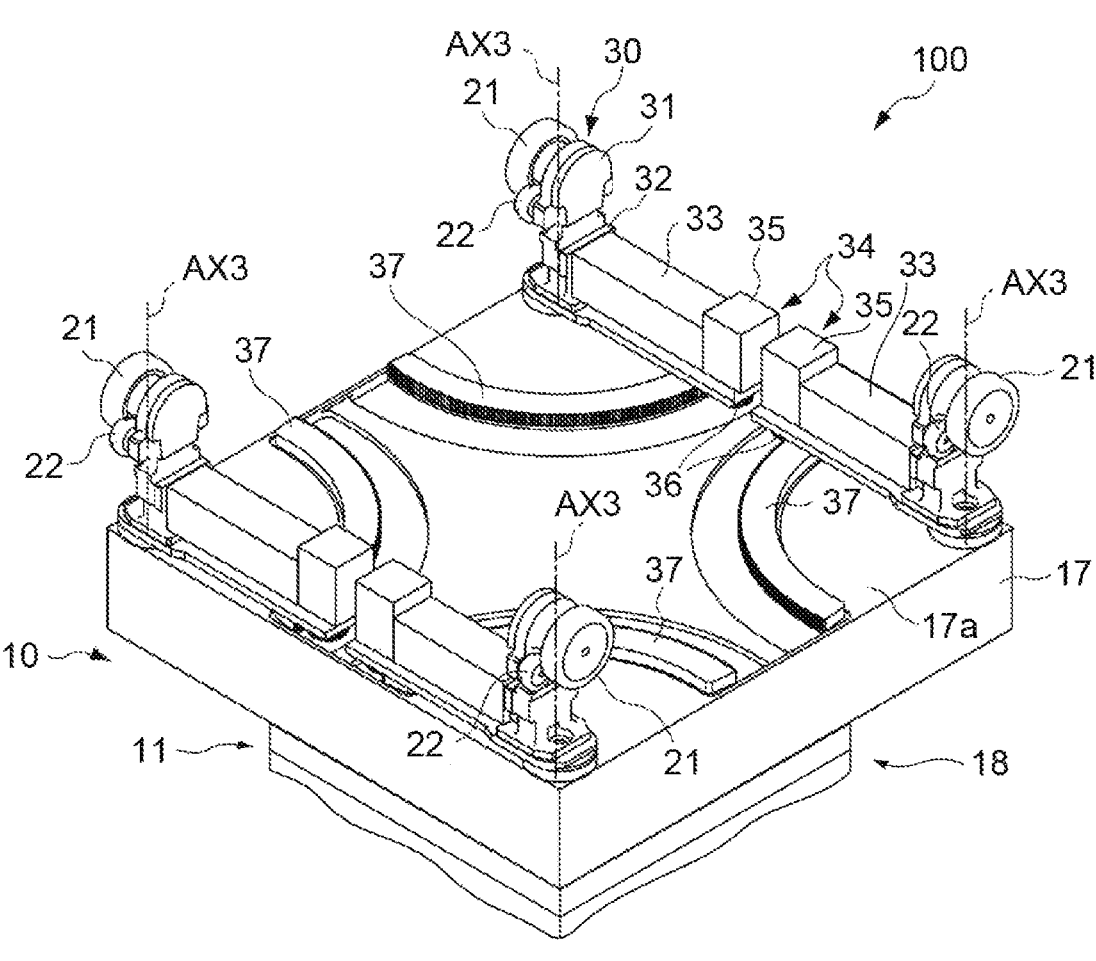
FIG. 2 is a perspective view illustrating an overhead transport vehicle according to the example.
Figure 3:
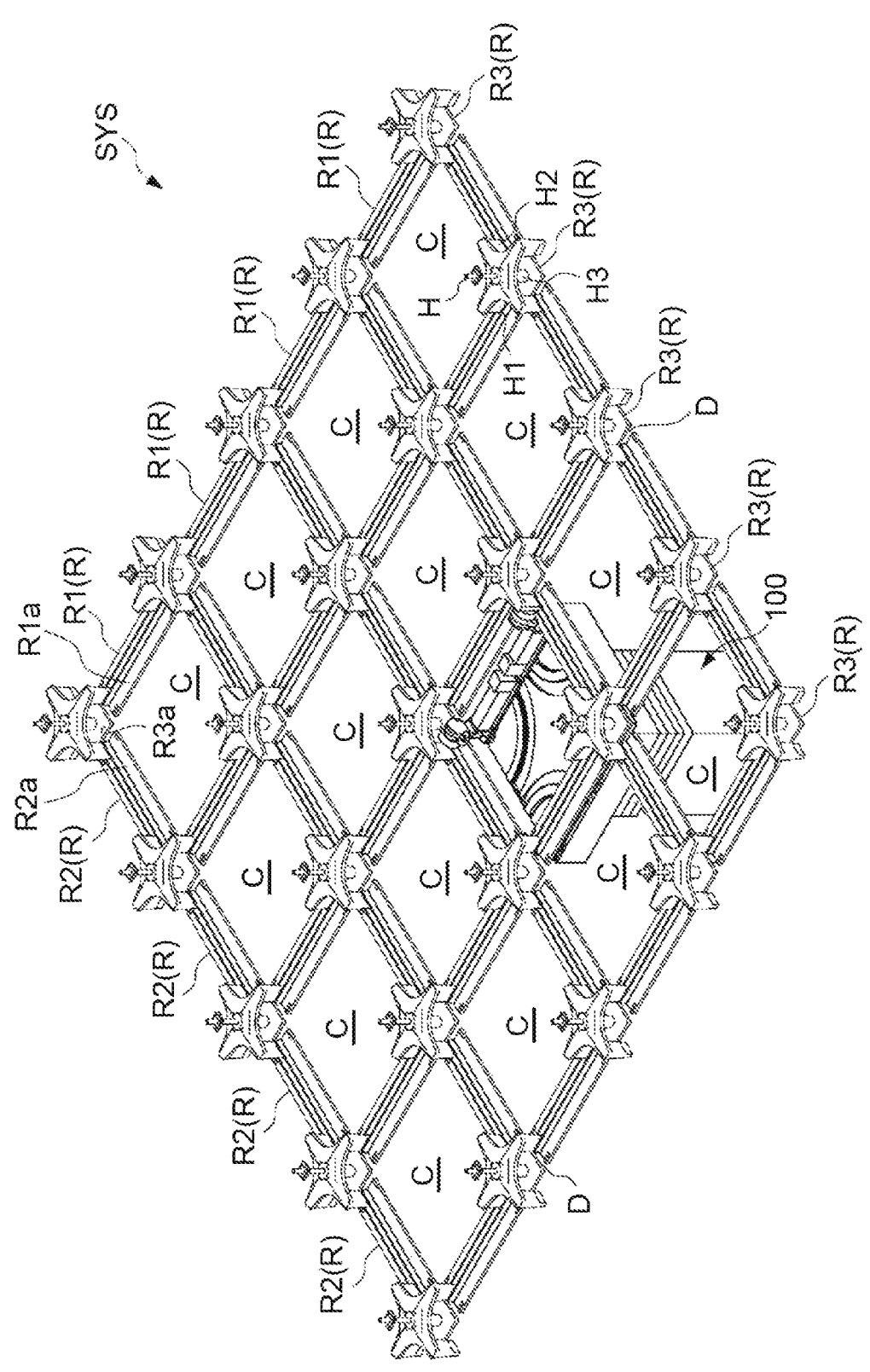
FIG. 3 is a perspective view illustrating the overhead storage system according to the example.

As illustrated in FIGS. 1, 2, and 3, an overhead storage system SYS is a system for transporting and storing articles M in a clean room of a semiconductor manufacturing plant, for example. The overhead storage system SYS includes an overhead transport vehicle 100, a storage rack 4, and a system controller 5. Examples of the articles M include a FOUP configured to accommodate semiconductor wafers and a reticle pod configured to accommodate reticles. Each article M includes a box-shaped container body M0 a side portion of which is open, a flange Ma provided on an upper surface of the container body M0, and a lid Mb provided on the side portion of the container body M0 in a detachable manner.

The overhead transport vehicle 100 moves along a rail R of the overhead storage system SYS and transports an article M. The overhead transport vehicle 100 is also referred to as an overhead traveling vehicle because it travels near a ceiling of a building. A plurality of the overhead transport vehicles 100 may be provided, for example. Transporting articles M by the plurality of the overhead transport vehicles 100 enables high-density transportation, which can improve the efficiency of transporting articles M.

The rail R is installed on a ceiling of a building such as a clean room or near the ceiling. The rail R is a grid-patterned rail including a plurality of first rails R1, a plurality of second rails R2, and a plurality of intersection rails R3. The rail R is arranged at least partially in a grid pattern. The first rails R1 are portions forming crossbars in the grid pattern, and are provided along the X direction (first direction). The second rails R2 are portions forming cross-bars in the grid pattern, and are provided along the Y direction (second direction). The intersection rails R3 are portions forming intersections in the grid pattern, and are disposed with a gap D with respect to respective ends of the first rails R1 and respective ends of the second rails R2.

In the rail R, the first rails R1 and the second rails R2 are provided along orthogonal directions, whereby a plurality of cells C (compartments) are adjacent to each other in plan view. The cells C form a matrix in the grid pattern of the rail R. Each cell C is an area defined by a pair of the first rails R1 aligned in the Y direction and a pair of the second rails R2 aligned in the X direction. In FIG. 3, part of the rail R is illustrated, and the same configuration of the rail R is formed continuously in the X direction and the Y direction from the illustrated configuration.

The first rails R1, the second rails R2, and the intersection rails R3 are suspended and supported on the ceiling by suspending members H (see FIG. 3). Each suspending member H has first portions H1 for suspending first rails R1, second portions H2 for suspending second rails R2, and a third portion H3 for suspending an intersection rail R3. The first portions H1 and the second portions H2 are each formed at two locations with the third portion H3 interposed therebetween.

The first rails R1, the second rails R2, and the intersection rails R3 have traveling surfaces R1a, R2a, and R3a, respectively, on which traveling wheels 21 (described later) of each overhead transport vehicle 100 travel. The gap D is a space through which a coupling section 30 described later, which is a part of the overhead transport vehicle 100, passes when the overhead transport vehicle 100 travels on a first rail R1 and crosses a second rail R2, or when it travels on a second rail R2 and crosses a first rail R1. The gap D is provided so as to have a width that allows the coupling section 30 to pass therethrough. The first rails R1, the second rails R2, and the intersection rails R3 are provided along the same horizontal plane.

As illustrated in FIGS. 1 and 2, the overhead transport vehicle 100 is a transport vehicle capable of traveling along the rail R, and includes a body section 10, a traveling unit 20, the coupling section 30, and a vehicle controller (control unit) 50. The body section 10 is disposed below the rail R. The body section 10 is formed in a rectangular shape, for example, in plan view. The body section 10 is formed to have dimensions that fit into one cell C in the rail R in plan view. This allows the overhead transport vehicle 100 to pass another one traveling on the adjacent first rail R1 or the adjacent second rail R2. The body section 10 is suspended from the traveling unit 20 and holds an article M below the rail R. The body section 10 includes an upper unit 17 and a transfer device 18.

The upper unit 17 is suspended and supported by the traveling unit 20 with the coupling section 30 interposed therebetween. The upper unit 17 is rectangular in plan view, for example, and has four corners on an upper surface 17a thereof. On each of the four corners of the body section 10, a traveling wheel 21, the coupling section 30, and a direction-changing mechanism 34 are provided.

The transfer device 18 is a device capable of transferring an article M to and from at least the storage rack 4 and a load port 62. The transfer device 18 is provided below the upper unit 17. The transfer device 18 includes an article holding unit 13 configured to hold an article M, a lifting drive unit 14 configured to raise and lower the article holding unit 13 in the vertical direction, a look-down sensor S provided to the lifting drive unit 14, a slide drive unit 11 configured to slide and move the lifting drive unit 14, a turning unit 12 configured to hold the slide drive unit 11, a first pivoting drive unit 15 configured to horizontally pivot (rotationally drive) the slide drive unit 11 about a first vertical axis AX1 with respect to the body section 10, and a second pivoting drive unit 16 configured to horizontally pivot the lifting drive unit 14 about a second vertical axis AX2 with respect to the slide drive unit 11.

The lifting drive unit 14 and the slide drive unit 11 constitute a linear drive unit configured to drive the article holding unit 13 to move linearly. The first pivoting drive unit 15 and the second pivoting drive unit 16 constitute a pivoting drive unit configured to drive the article holding unit 13 to horizontally pivot. Horizontally pivoting means pivoting about an axis along the vertical direction as the axis of rotation.

The slide drive unit 11 includes a plurality of movable plates disposed in a stacked manner in the Z direction, for example. The movable plates are movable in the Y direction. To the lowermost movable plate, the second pivoting drive unit 16 is attached. The slide drive unit 11 can move the movable plates by a driving device (not illustrated) and slide and move the lifting drive unit 14 and the article holding unit 13 attached to the lowermost movable plate so as to protrude in one direction with respect to the traveling direction, that is, in one direction of linear directions. The turning unit 12 is attached to the first pivoting drive unit 15 between the slide drive unit 11 and the upper unit 17, and holds the slide drive unit 11.

The article holding unit 13 grips the flange Ma of an article M, thereby suspending and holding the article M. The article holding unit 13 is, for example, a chuck including horizontally movable claws 13a. By causing the claws 13a to proceed to below the flange Ma of the article M and raising the article holding unit 13, the article M is held. The article holding unit 13 is connected to suspending members 13b such as wires or belts.

The lifting drive unit 14 is attached to the second pivoting drive unit 16. The lifting drive unit 14 is, for example, a hoist configured to lower the article holding unit 13 by paying out the suspending members 13b and raise the article holding unit 13 by winding the suspending members 13b. The lifting drive unit 14 is controlled by the vehicle controller 50 to lower or raise the article holding unit 13 at a predetermined speed. The lifting drive unit 14 is controlled by the vehicle controller 50 to hold the article holding unit 13 at a target height. The lifting drive unit 14 is configured such that a side thereof on a side opposite to the lid Mb side of the article M held by the article holding unit 13 protrudes more in the horizontal direction than a side on the lid Mb side does. Specifically, when the lifting drive unit 14 holds the article M by the article holding unit 13, the dimension from the center to an end of the lifting drive unit 14 on the side opposite to the lid Mb side is larger than the dimension from the center to an end thereof on the lid Mb side of the article M, in the horizontal direction.

The look-down sensor S outputs a directional detection wave, such as a laser beam, downward. The look-down sensor S may be configured to emit other detection waves such as ultrasonic waves. The look-down sensor S is provided so as to output the detection wave almost directly below the lifting drive unit 14. For example, the look-down sensor S is attached to an end of the lifting drive unit 14 on the side protruding in the horizontal direction (one end on a side on which the distance from the center is greater). The look-down sensor S is disposed on the side opposite to the lid Mb side apart from the article M held by the article holding unit 13, by a predetermined length α, when viewed from above. In other words, when the article M is held in the article holding unit 13, for example, the second pivoting drive unit 16 is driven and the lifting drive unit 14 is positioned such that the look-down sensor S is always located on the side opposite the lid Mb side.

The look-down sensor S emits a laser beam LO (see FIG. 7) toward the outer vicinity of a position to which the article holding unit 13 has been lowered, and receives its reflected light. The look-down sensor S detects, based on the reflected light of the received laser beam LO, whether an obstacle is present on the side opposite to the lid Mb side of the article M held by the article holding unit 13. For example, the look-down sensor S detects whether an obstacle such as an operator is present in an ascending and descending path that is on a side of the load port 62 (see FIG. 7) closer to a passage (side opposite to a processing device 6).

The first pivoting drive unit 15, for which an electric motor or the like is used, rotates the turning unit 12 about the first vertical axis AX1. The first pivoting drive unit 15 can rotate the turning unit 12 and also rotate the slide drive unit 11 about the first vertical axis AX1. When the slide drive unit 11 is rotated about the first vertical axis AX1 by the first pivoting drive unit 15, the second pivoting drive unit 16, the lifting drive unit 14, and the article holding unit 13 that are attached to the lower side of the slide drive unit 11 are rotated together about the first vertical axis AX1. The second pivoting drive unit 16, for which an electric motor or the like is used, rotates the lifting drive unit 14 about the second vertical axis AX2. When the lifting drive unit 14 is rotated about the second vertical axis AX2 by the second pivoting drive unit 16, the article holding unit 13 that is attached to the lower side of the lifting drive unit 14 is rotated together about the second vertical axis AX2.

As illustrated in FIGS. 1, 2, and 3, the traveling unit 20 travels on the rail R. The traveling unit 20 includes the traveling wheels 21 and auxiliary wheels 22. The traveling wheels 21 are disposed at the respective four corners of the upper surface 17a of the upper unit 17 (the body section 10). Each traveling wheel 21 is attached to an axle (not illustrated) provided to the corresponding coupling section 30. The axles are provided parallel or substantially parallel along the XY plane. Each traveling wheel 21 is rotated by the driving force of the traveling drive unit 33 described later. Each traveling wheel 21 rolls on the rail R. The respective traveling wheels 21 roll on the traveling surfaces R1a, R2a, and R3a of the first rail R1, the second rails R2, and the intersection rails R3 in the rail R, thereby causing the overhead transport vehicle 100 to travel. All of the four traveling wheels 21 do not necessarily have to be rotationally driven by the driving force of the traveling drive unit 33, and only some of the four traveling wheels 21 may be configured to be rotationally driven.

Each traveling wheel 21 is provided to be able to pivot about a pivot axis AX3. The traveling wheel 21 is horizontally pivoted by the corresponding direction-changing mechanism 34 described later, whereby the traveling direction of the overhead transport vehicle 100 can be changed. The auxiliary wheels 22 are disposed each in front of and rear of the traveling wheel 21 in the traveling direction. Each of the auxiliary wheels 22 can rotate in the same manner as the traveling wheel 21. The lower ends of the auxiliary wheels 22 are set higher than the lower end of the traveling wheel 21. Thus, when the traveling wheel 21 is traveling on the traveling surfaces R1a, R2a, and R3a, the auxiliary wheels 22 do not come into contact with the traveling surfaces R1a, R2a, and R3a. When the traveling wheel 21 passes over a gap D (see FIG. 3), the auxiliary wheels 22 come into contact with the traveling surfaces R1a, R2a, and R3a to prevent the traveling wheel 21 from falling. Two auxiliary wheels 22 do not necessarily have to be provided to one traveling wheel 21. For example, one auxiliary wheel 22 may be provided to one traveling wheel 21, or no auxiliary wheel 22 may be provided.

As illustrated in FIG. 1, in the traveling unit 20, a cover W may be provided to surround the transfer device 18 and the article M held by the transfer device 18. The cover W has a shape that is open at the lower end thereof, and has such a shape that a portion thereof through which the movable plates of the slide drive unit 11 protrude (portion through which they slide and move) is recessed. The cover W, the upper end of which is attached to the turning unit 12, turns about the first vertical axis AX1 as the turning unit 12 turns.

The coupling sections 30 couple the upper unit 17 of the body section 10 to the traveling unit 20. The coupling sections 30 are provided at the respective four corners of the upper surface 17a of the upper unit 17 (the body section 10). By these coupling sections 30, the body section 10 is suspended and disposed below the rail R. Each coupling section 30 includes a support member 31 and a connecting member 32. The support member 31 rotatably supports the rotating shaft of the corresponding traveling wheel 21 and the rotating shafts of the corresponding auxiliary wheels 22. The support member 31 maintains the relative position between the traveling wheel 21 and the auxiliary wheels 22. The support member 31 is formed in a plate-like shape, for example, and is formed to have a thickness capable of passing through each gap D.

The connecting member 32 extends downward from the support member 31 and is coupled to the upper surface 17a of the upper unit 17 to hold the upper unit 17. The connecting member 32 includes inside a transmission mechanism configured to transmit the driving force of the traveling drive unit 33 described later to the traveling wheel 21. This transmission mechanism may have a configuration using a chain or a belt, or may have a configuration using a gear train. The connecting member 32 is provided to be rotatable about the pivot axis AX3. This connecting member 32 rotates about the pivot axis AX3, thereby being able to horizontally pivot the traveling wheel 21.

Each coupling section 30 is provided with the traveling drive unit 33 and the direction-changing mechanism 34. The traveling drive unit 33 is mounted on the corresponding connecting member 32. The traveling drive unit 33 is a driving source configured to drive the traveling wheel 21 and, for example, an electric motor is used therefor. Each of the four traveling wheels 21 is driven by the corresponding traveling drive unit 33 to serve as a driving wheel. The four traveling wheels 21 are controlled by the vehicle controller 50 to have the same or substantially the same rotation speed. If any of the four traveling wheels 21 is not used as a driving wheel, the traveling drive unit 33 is not mounted on the corresponding connecting member 32.

The direction-changing mechanism 34 horizontally pivots the traveling wheel 21 by pivoting the connecting member 32 of the coupling section 30 about the pivot axis AX3 with respect to the body section 10. By horizontally pivoting the traveling wheel 21, the overhead transport vehicle 100 can switch from a first state of traveling in the X direction to a second state of traveling in the Y direction, or from the second state of traveling in the Y direction to the first state of traveling in the X direction.

The direction-changing mechanism 34 includes a driving source 35, a pinion gear 36, and a rack 37. The driving source 35 is attached on a side surface of the traveling drive unit 33 away from the pivot axis AX3. For the driving source 35, for example, an electric motor is used. The pinion gear 36 is attached to a lower side of driving source 35, and is rotated by the driving force generated by the driving source 35. The pinion gear 36 is circular in plan view and has a plurality of teeth in the circumferential direction of its outer circumference. The rack 37 is fixed to the upper surface 17a of the upper unit 17. The rack 37 is provided at each of the four corners of the upper surface 17a of the upper unit 17, and is formed in an arc shape centered around the pivot axis AX3 of the corresponding traveling wheel 21. The rack 37 has a plurality of teeth, which mesh with the teeth of the pinion gear 36, in the circumferential direction of its outer circumference. The pinion gear 36 and the rack 37 are disposed with their teeth meshing with each other. When the pinion gear 36 rotates, the pinion gear 36 accordingly moves in the circumferential direction centered around the pivot axis AX3 along the outer circumference of the rack 37. By this movement of the pinion gear 36, the connecting member 32 is pivoted, and the traveling drive unit 33 and the direction-changing mechanism 34 are pivoted together with the pinion gear 36 in the circumferential direction centered around the pivot axis AX3.

By this pivoting of the direction-changing mechanism 34, each of the traveling wheels 21 and the auxiliary wheels 22 disposed at the four corners of the upper surface 17a is horizontally pivoted about the pivot axis AX3. The driving of the direction-changing mechanism 34 is controlled by the vehicle controller 50. The vehicle controller 50 may give an instruction to pivot the four traveling wheels 21 at the same timing, or may give an instruction to pivot them at different timings. By pivoting the traveling wheels 21 and the auxiliary wheels 22, the traveling wheels 21 shift from a state of being in contact with one of the first rails R1 and the second rails R2 to a state of being in contact with the other. This allows the overhead transport vehicle 100 to switch between the first state of traveling in the X direction and the second state of traveling in the Y direction.

The vehicle controller 50 is a computer including a central processing unit (CPU), a read only memory (ROM), and a random access memory (RAM). The vehicle controller 50 can be configured, for example, as software such that a program stored in the ROM that is loaded into the RAM to be executed by the CPU. The vehicle controller 50 may be configured as hardware such as an electronic circuit. The vehicle controller 50 may be configured with a single device, or may be configured with a plurality of devices. If it is configured with a plurality of devices, those devices are connected via a communication network such as the Internet or an intranet to logically construct a single vehicle controller 50. The vehicle controller 50 is provided in the body section 10, but may be provided outside the body section 10.

The vehicle controller 50 collectively controls operations of the respective components of the overhead transport vehicle 100. The vehicle controller 50 controls operation of the overhead transport vehicle 100 on the basis of transport instructions. The vehicle controller 50 controls traveling of the overhead transport vehicle 100 by controlling the traveling drive unit 33 and the direction-changing mechanism 34, for example. The vehicle controller 50 controls transfer operation of the overhead transport vehicle 100 on the basis of transfer instructions. The vehicle controller 50 controls the transfer operation of the overhead transport vehicle 100 by controlling the transfer device 18, for example. The vehicle controller 50 generates and updates status information periodically. The vehicle controller 50 transmits the status information to the system controller 5. The status information is, for example, information on the current position of the overhead transport vehicle 100, information indicating the current status of the overhead transport vehicle 100 such as normal or abnormal, and information on the status (execution in progress, execution completed, or execution failed) of various instructions such as transport instructions executed by the overhead transport vehicle 100.

Figure 4:
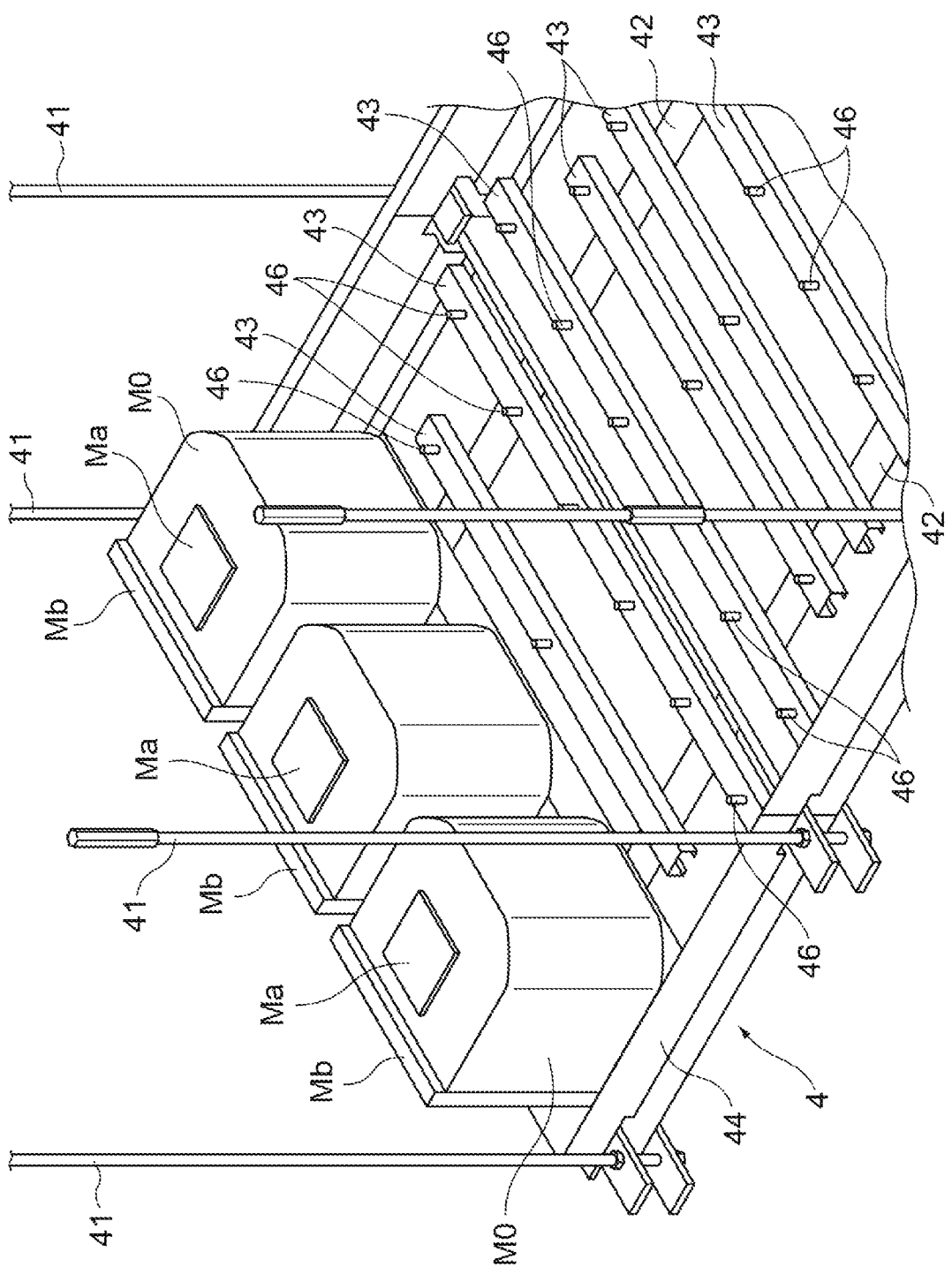
FIG. 4 is a perspective view illustrating a storage rack according to the example.
Figure 5:
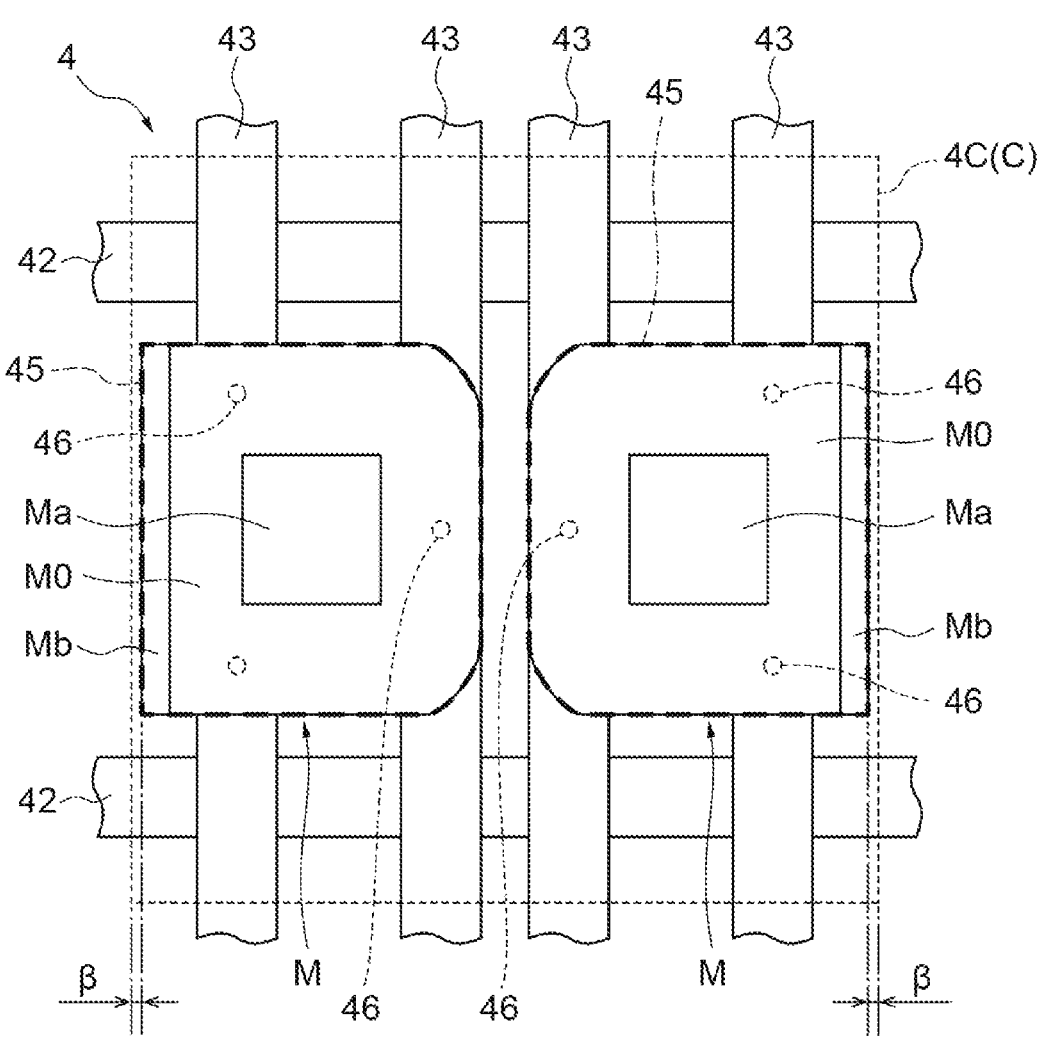
FIG. 5 is a plan view illustrating a storage area of the storage rack according to the example.
Figure 6:
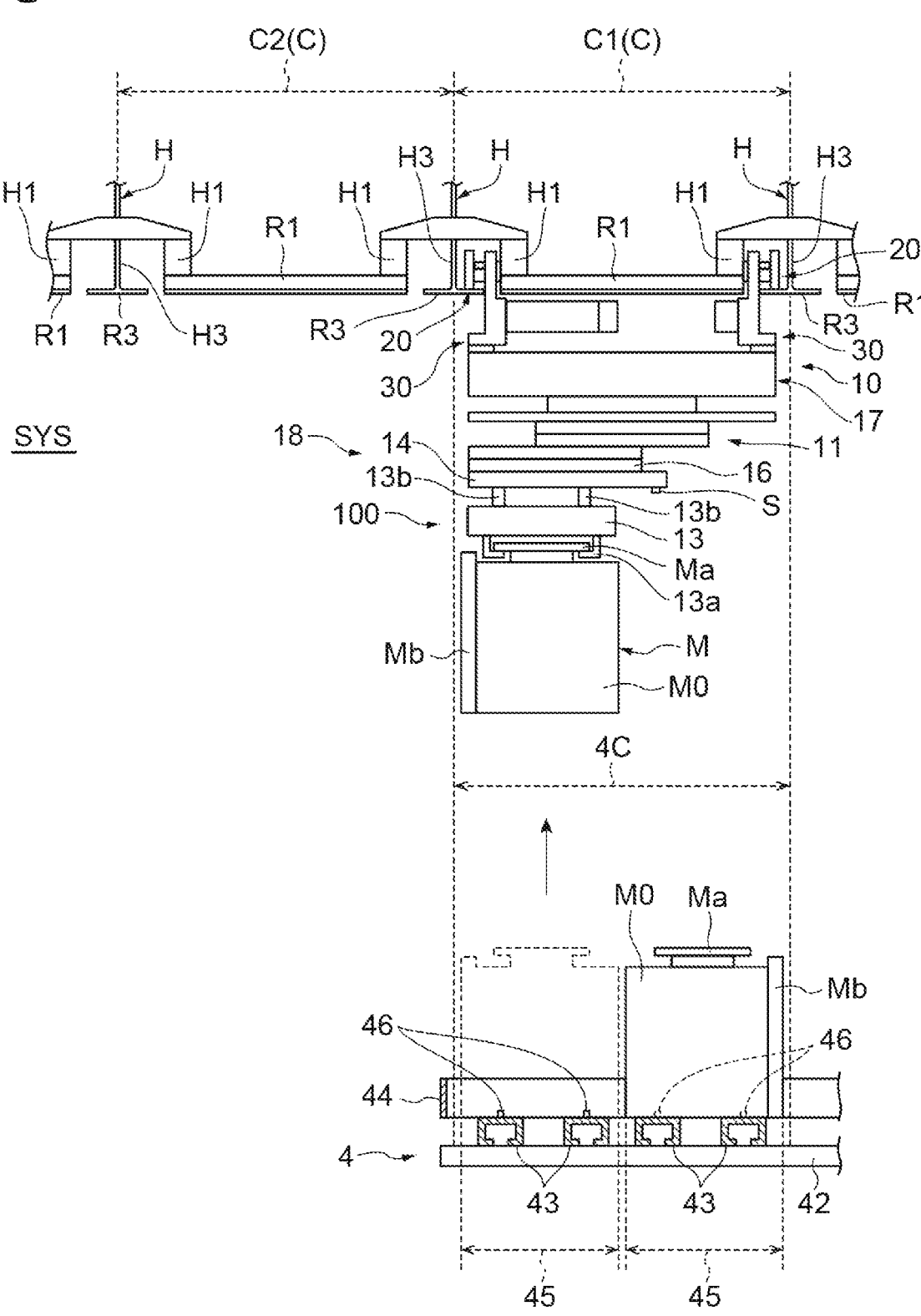
FIG. 6 is a side view illustrating an example of transferring an article from the storage rack in the overhead storage system according to the example.

As illustrated in FIGS. 4, 5, and 6, the storage rack 4 is a rack disposed below the rail R and configured to store articles M. The storage rack 4 is a rack disposed in a suspended manner below the traveling path of overhead transport vehicle 100 and configured for an article M to be temporarily put thereon. The storage rack 4 is suspended and supported on the ceiling by hanging rods 41. The hanging rods 41 are connected to, for example, the suspending members H (see FIG. 3).

The storage rack 4 includes a plurality of girder members 42 extending along the horizontal direction, a plurality of beam members 43 extending along a direction intersecting (here, orthogonal to) the girder members 42, and fence members 44 disposed along the periphery of the storage rack 4. For the girder members 42 and the beam members 43, for example, lip channel steel (C-shaped steel) is used. The beam members 43 are fixed on the girder members 42. The upper surfaces of the beam members 43 form placement surfaces on which articles M are placed. The fence members 44 are members configured to prevent the articles M from falling from the storage rack 4. The fence members 44 protrude above the beam members 43. The storage rack 4 is not limited to a particular one, and may be, for example, a structure disposed on the floor and including a plurality of shelves arranged in parallel in the vertical direction.

As illustrated in FIG. 5, in the storage rack 4, a plurality of article placement areas 45 on which articles M can be placed by the transfer device 18 are set in a storage area 4C corresponding to each cell C. This illustrated example is an example in which two article placement areas 45 are set in the storage area 4C. The storage area 4C is a rectangular area on the storage rack 4, which overlaps the cell C when viewed from above. For example, the storage area 4C is a rectangular area on the storage rack 4 that, when viewed from above, is the same as a rectangle formed by connecting the respective centers of four intersection rails R3.

Each article placement area 45 is an area corresponding to the shape of an article M in the storage area 4C. The article placement area 45 is a partial area of the storage area 4C, which has the same shape as that of the article M when viewed from above. Each of the article placement areas 45 is provided with positioning pins 46. The positioning pins 46 are formed on the corresponding beam members 43 so as to protrude upward. The positioning pins 46 fit into grooves on the bottom surface of an article M to position the article M when the article M is placed on the article placement area 45 of the storage rack 4.

The storage rack 4 is configured such that an article M with the lid Mb facing outside of the storage area 4C can be placed (received) on each of the article placement areas 45. In other words, articles M with the lids Mb facing the outside of the storage area 4C are placed on the respective article placement areas 45. In the storage rack 4, the articles M are to be placed on the respective article placement areas 45 such that sides of the articles M opposite to the lid Mb sides thereof face each other. In other words, on the respective article placement areas 45, the articles M with the sides opposite to the lid Mb sides facing inside of the storage area 4C are placed. In the respective article placement areas 45, the articles are placed such that the lids Mb thereof are aligned along outer edges of the storage area 4C. On the article placement areas 45, the articles M are placed so as to be adjacent to each other. The distance R between an edge of the storage area 4C and an article placement area 45 adjacent to this edge is smaller than a predetermined length a (see FIG. 1) between the article M held in the article holding unit 13 and the look-down sensor S.

Referring back to FIG. 1, the system controller 5 is a computer including a CPU, a ROM, and a RAM. The system controller 5 can be configured, for example, as software such that a program stored in the ROM is loaded into the RAM to be executed by the CPU. The system controller 5 may be configured as hardware such as an electronic circuit. The system controller 5 may be configured with a single device, or may be configured with a plurality of devices. If it is configured with a plurality of devices, they are connected via a communication network such as the Internet or an intranet to logically construct a single system controller 5.

The system controller 5 generates a transport instruction. The system controller 5 selects any one of the overhead transport vehicles 100 capable of transporting an article M, and assigns the transport instruction to the selected overhead transport vehicle 100. The transport instruction includes a traveling instruction to perform traveling to a transport source, an instruction to grab an article M placed on the transport source, a traveling instruction to perform traveling to a transport destination, and an instruction to unload the article M being held onto the transport destination. A traveling path to be followed when traveling to a load port 62 at the transport source on the rail R can be acquired by various known methods. A traveling path to be followed when traveling to a load port 62 at the transport destination on the rail R can likewise be acquired by various known methods.

Figure 7:
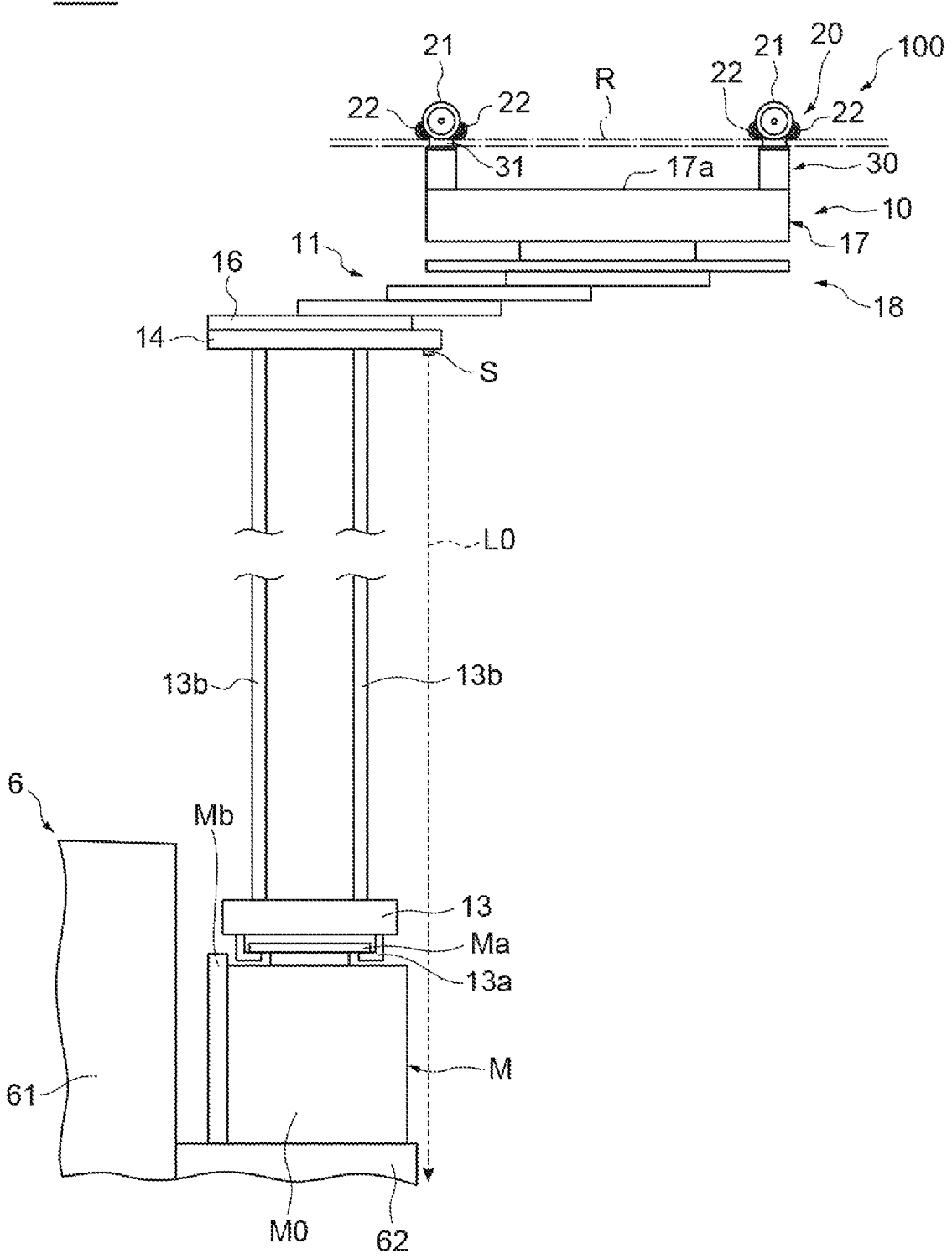
FIG. 7 is a side view illustrating an example of transferring the article to a load port in the overhead storage system according to the example.

The transport source and the transport destination include the storage rack 4 and the respective load ports 62 (see FIG. 7). Each load port 62 is a placement platform in the processing device 6 (see FIG. 7) configured to perform various types of processing on articles M. The load port 62 is disposed on a side of a device body 61 (see FIG. 7) of the processing device 6 closer to the passage. The load port 62 has an orientation in which, for example, the side of the load port 62 closer to the passage is the front side thereof. An article M is placed on the load port 62 such that the lid Mb thereof faces the device body 61. Information on the transport source and the transport destination can be received from a host controller (not illustrated), for example.

In the overhead transport vehicle 100, for example, when a transport instruction indicating that the storage rack 4 is set as a transport source and a load port 62 is set as a transport destination has been assigned by the system controller 5, the following processing is performed by the vehicle controller 50.

In the example illustrated in FIG. 6, as cells C, a first cell C1 corresponding to the storage area 4C that includes the article placement areas 45 on which an article M to be transported is placed and a second cell C2 adjacent to this first cell C1 are present. To begin with, the vehicle controller 50 stops the overhead transport vehicle 100 on the first cell C1. With the overhead transport vehicle 100 stopped on the first cell C1, the vehicle controller 50 causes the transfer device 18 to transfer (grab) the article M from the corresponding article placement area 45 of the first cell C1. In other words, with the overhead transport vehicle 100 stopped on the cell C, the vehicle controller 50 executes transfer control of causing the transfer device 18 to transfer the article M to or from any of the article placement areas 45 in the cell C ("transfer control").

In the transfer control, for example, the second pivoting drive unit 16 is driven to horizontally pivot the lifting drive unit 14, whereby the lifting drive unit 14 is disposed such that the look-down sensor S is disposed on a side opposite to the lid Mb side. In this state, the article M is held by the article holding unit 13. The look-down sensor S is provided to a horizontally protruding portion of the lifting drive unit 14, and thus the lifting drive unit 14 protrudes on the side opposite to the lid Mb side (inside of the first cell C1), whereas the lifting drive unit 14 does not protrude on the lid Mb side (outside of the first cell C1) during the transfer control. In other words, when the transfer control is being executed, the transfer device 18 is within the first cell C1 without jutting into the second cell C2 when viewed from above. During the transfer control to and from the storage rack, the look-down sensor S is turned off.

The vehicle controller 50 causes the overhead transport vehicle 100 to travel along a traveling path based on the transport instruction to a position where the article M can be transferred to the load port 62 at the transport destination while grabbing the article M. As illustrated in FIG. 7, with the overhead transport vehicle 100 stopped, the vehicle controller 50 causes the transfer device 18 to transfer (unload) the article M onto the load port 62. When the article M is transferred to or from the load port 62, the look-down sensor S is turned on and a laser beam L0 is emitted downward from the look-down sensor S to detect whether an obstacle such as an operator is present in the ascending and descending path that is on a side of the load port 62 closer to the passage.

When a transport instruction indicating that an article placement area 45 of the storage rack 4 is set as a transport destination has been assigned, with the overhead transport vehicle 100 grabbing an article M stopped on a cell C corresponding to the article placement area 45, the vehicle controller 50 executes the same transfer control as described above to transfer (unload) the article M to the storage rack 4. When a transport instruction indicating that a load port 62 is set as a transport source has been assigned, the overhead transport vehicle 100 is caused to travel and stopped at a position where the article M can be transferred from the load port 62, and the article M is transferred (grabbed) from the load port 62 by the transfer device 18.

As described above, in the overhead storage system SYS, in the storage area 4C corresponding to each cell C in the storage rack 4, the article placement areas 45 on which articles M can be placed by the transfer device 18 are set. Thus, it is possible to store a large number of articles M without upsizing the storage rack 4, for example, and increase the efficiency of storing the articles M.

In the overhead storage system SYS, the rail R includes a plurality of first rails R1 extending along the X direction, a plurality of second rails R2 extending along the Y direction, and a plurality of intersection rails R3 disposed with a gap D formed between an end of each first rail R1 and the intersection rail and between an end of each second rail R2 and the intersection rail. Each cell C is an area defined by a pair of the first rails R1 aligned in the Y direction and a pair of the second rails R2 aligned in the X direction. With this configuration, the overhead transport vehicle 100 can be specifically configured to travel along the rail R arranged in the grid pattern.

In the overhead storage system SYS, with the overhead transport vehicle 100 stopped on one of the cells C, the vehicle controller 50 executes transfer control of causing the transfer device 18 to transfer the article M to or from any of the article placement areas 45 in the storage area 4C corresponding to this cell C. In this example, to or from any of the article placement areas 45 in the storage area 4C, in turn, between a transport source and a transport destination that are set from among the article placement areas 45, the article can be specifically transported.

In the overhead storage system SYS, a first cell C1 and a second cell C2 adjacent to the first cell C1 are present as the cells C. In the transfer control, with the overhead transport vehicle 100 stopped on the first cell C1, the article M is transferred to or from any of the article placement areas 45 in the storage area 4C corresponding to the first cell C1. When the transfer control is being executed, the transfer device 18 is within the first cell C1 without jutting into the second cell C2 when viewed from above. In this example, while an overhead transport vehicle 100 is executing the transfer control on the first cell C1, jutting of the transfer device 18 of the overhead transport vehicle 100 into the second cell C2 can be prevented. Thus, another overhead transport vehicle 100 is not prevented from traveling on the second cell C2, and this other overhead transport vehicle 100 can pass over the second cell C2. With this configuration, the transport efficiency can be also increased. This also makes it possible to prevent the overhead transport vehicles 100 from come into contact with each other.

In the overhead storage system SYS, the article M includes a container body M0 and a lid Mb provided on a side portion of the container body M0. In the storage rack 4, the article M with the lid Mb facing outside of the storage area 4C can be placed in each of the article placement areas 45. The transfer device 18 includes an article holding unit 13, a lifting drive unit 14, and a look-down sensor S. The look-down sensor S is provided to the lifting drive unit 14, is disposed on a side opposite to the lid Mb side at a predetermined length a apart from the article M held by the article holding unit 13 when viewed from above, and outputs a laser beam L0 downward. The article M is placed on the article placement area 45 with the lid Mb facing outside of the storage area 4C, and thus the look-down sensor S (a portion of the lifting drive unit 14 that protrudes more in the horizontal direction than the article M) is located within the storage area 4C in plan view during execution of the transfer control, unlike when the article M is placed on the article placement area 45 with the lid Mb facing inside of the storage area 4C. With this configuration, jutting of the transfer device 18 due to the presence of the look-down sensor S can be prevented during execution of the transfer control.

In the overhead storage system SYS, the distance R (see FIG. 5) between an edge of the storage area 4C and an article placement area 45 adjacent to this edge is smaller than the predetermined length a (see FIG. 1). If the distance β is smaller than the predetermined length α as described above, the look-down sensor S is likely to be located outside the storage area 4C in plan view during execution of the transfer control when the article M is placed on the article placement area 45 with the lid Mb facing inside of the storage area 4C. In this example, during execution of the transfer control, jutting of the transfer device 18 is accordingly likely to occur due to the presence of the look-down sensor S. Thus, the above-described effect of preventing jutting of the transfer device 18 is remarkable.

In the overhead storage system SYS, the overhead transport vehicle 100 travels on the rail R in the grid pattern, and thus the traveling paths for the overhead transport vehicle 100 can be selected easily and flexibly, whereby traffic congestion can be prevented and transport efficiency can be improved.

Although the example has been described above, this disclosure is not limited to the example, and various modifications may be made within the scope not departing from the spirit of the appended claims.

The materials and shapes of the respective configurations in the example and modifications above are not limited to those described above, and various materials and shapes can be used. Each configuration in the example or the modifications can be optionally applied to each configuration in other examples or modifications. Some of the respective configurations in the example or the modifications may be omitted as appropriate within the scope not departing from the spirit of the appended claims.

The invention claimed is:

1. An overhead storage system comprising:

an overhead transport vehicle including a traveling unit configured to travel on a rail arranged at least partially in a grid pattern and a body section suspended from the traveling unit and configured to hold an article below the rail;

a storage rack disposed below the rail and configured to store the article; and a control unit configured to control operation of the overhead transport vehicle, wherein the body section includes a transfer device adapted to transfer the article to and from the storage rack, and in the storage rack, a plurality of article placement areas on which the article is adapted to be placed by the transfer device are set in a storage area corresponding to each of cells forming a matrix in the grid pattern of the rail; wherein the article includes a container body and a lid provided on a side of the container body, the article with the lid facing outside of the storage area is adapted to be placed in each of the article placement areas in the storage rack, the transfer device includes:

an article holding unit configured to suspend and hold the article by gripping the article:

a lifting drive unit configured to raise and lower the article holding unit; and a look-down sensor provided to the lifting drive unit and disposed, on a side opposite to a side closer to the lid, at a predetermined length apart from the article held by the article holding unit when viewed from above and configured to output a detection wave downward.

2. The overhead storage system according to claim 1, wherein the rail includes:

a plurality of first rails extending along a first direction;

a plurality of second rails extending along a second direction intersecting the first direction, and a plurality of intersection rails arranged with a gap with respect to respective ends of the first rails and respective ends of the second rails, the gap allowing passage of a coupling section coupling the traveling unit to the body section, and each cell is an area defined by a pair of the first rails aligned in the second direction and a pair of the second rails aligned in the first direction.

3. The overhead storage system according to claim 1, wherein with the overhead transport vehicle stopped on one of the cells, the control unit executes transfer control of causing the transfer device to transfer the article to or from any of the article placement areas in the storage area corresponding to this cell.

4. The overhead storage system according to claim 3, wherein a first cell and a second cell adjacent to the first cell are present as the cells, in the transfer control, with the overhead transport vehicle stopped on the first cell, the article is transferred to or from any of the article placement areas in the storage area corresponding to the first cell, and when the control unit is executing the transfer control, the transfer device is within the first cell without jutting into the second cell when viewed from above.

* * * * *